United States Patent [19]

Tuck

[11] 4,217,624
[45] Aug. 12, 1980

[54] COMMUNICATIONS INTERFACE ADAPTER

[75] Inventor: Winfree P. Tuck, Huntsville, Ala.

[73] Assignee: Inteq, Inc., Fairfax, Va.

[21] Appl. No.: 52,710

[22] Filed: Jun. 28, 1979

[51] Int. Cl.³ .............................................. H05K 7/14
[52] U.S. Cl. .................................... 361/394; 307/150;
361/380; 361/395; 361/399; 220/4 B
[58] Field of Search ............... 340/178, 177 R, 365 R;
339/17 R, 17 N, 17 L, 17 LC; 211/41; 361/380,
383, 346, 393–395, 399, 331, 384, 386; 307/150;
220/4 B

[56] References Cited
U.S. PATENT DOCUMENTS

| | | | |
|---|---|---|---|
| 2,902,630 | 9/1959 | Heazel, Jr. | 361/395 |
| 3,383,653 | 5/1968 | Bolton | 361/394 |
| 3,956,675 | 5/1976 | Bauer | 361/331 |
| 4,092,698 | 5/1978 | Brefka | 361/346 |

Primary Examiner—Gerald P. Tolin
Attorney, Agent, or Firm—Leitner, Palan, Lyman, Martin & Bernstein

[57] ABSTRACT

A single circuit board, having a communication interface adapter circuit including I/O and power supply connectors, switches and indicators mounted directly thereto, is mounted to the rear panel of a first housing portion via stand-off and fasteners. The front and rear panels of a first housing portion are parallel to the printed circuit board and include apertures to allow external access to the connectors, switches and indicators. A power supply in a separate housing is mounted to the rear panel of and external to the first housing portion.

8 Claims, 8 Drawing Figures

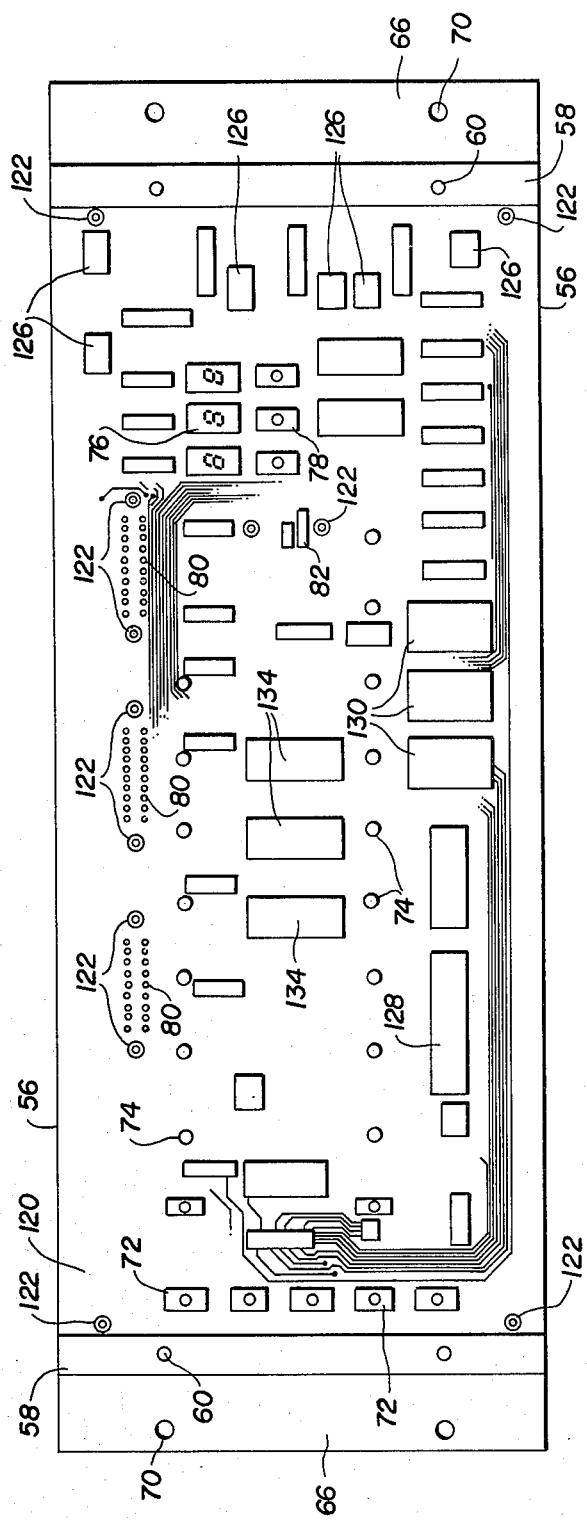
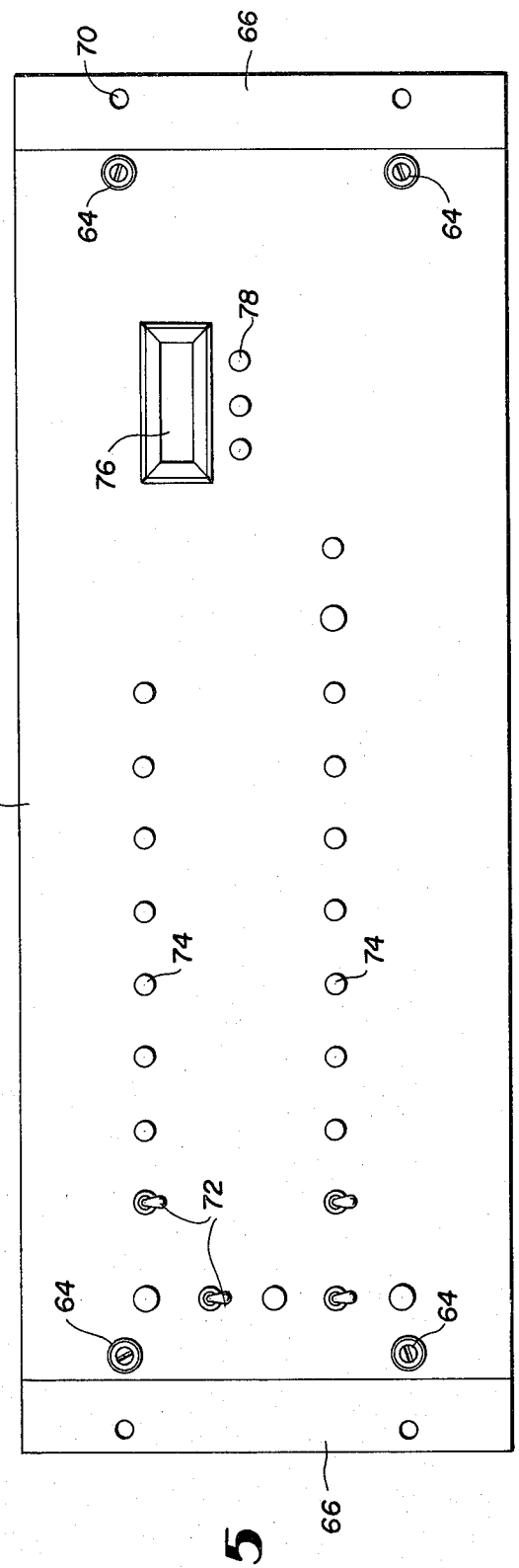
FIG.4
FIG.5

COMMUNICATIONS INTERFACE ADAPTER

BACKGROUND OF THE INVENTION

The present invention relates generally to communication interface adaptors and more specifically, to a housing for a single printed circuit board communication interface adaptor.

Communication interface adaptors of the prior art have generally included a plurality of circuits on individual printed circuit boards in a common housing with a power supply. The basic circuit boards have included, for example, central processing unit board, a read only memory board for storing the operational programs, a high speed RAM memory board, additional logic circuit boards, and a dedicated board per device to be interfaced to the line. A typical example is the unit illustrated in FIG. 1. A plurality of printed circuit boards 10 are contained in a board cage interconnected to a printed circuit back plane board 12 through the edge connectors of the individual pluged-in circuit boards. A plurality of input/output connectors 14 are mounted to the rear panel 16 and are connected by ribbon cables 18 to connectors 20 on the front of the printed circuit boards 10. The power supply 22 in the rear of the unit is connected to the back plane printed circuit board 12 by connector and line 24. The front panel 26 includes a plurality of switches 28 and indicators 30 mounted thereon and interconnected to the back plane printed circuit board by ribbon cable 32. A fan 34 is provided in the rear of the unit to cool the commonly housed power supply and printed circuit board elements. The communication interface adaptor of FIG. 1, by providing a plurality of printed circuit boards having individual electronic systems thereon, is readily adaptable to interface with any type of peripheral to any type of communication line. The trade-off for the universality is the increased size of the unit.

Communication interface adaptors dedicated to a specific peripheral interfacing with a specific line have been made using a single printed circuit board. As illustrated in FIG. 2, the single board 40 is mechanically mounted perpendicular to a face plate 42 and electrically interconnected thereto. A plurality of switches 44 and indicators 46 are contained on the face plate 42. The printed circuit 40 is interconnected electrically to the system it is dedicated to by edge connectors on the rear of the board. As can be seen, the single card communication interface adaptor follows the same development philosophy of the multiple board adaptor wherein the printed circuit boards are mounted perpendicular to the front panel, which includes the indicators and switches mounted thereon. The printed circuit board must be electrically interconnected to the front panel and is connected to the power supply and input terminals through additional connectors and cable which are attached to the rear edge connectors of the printed circuit board.

The interconnection of the printed circuit board to the front panel and the power supply through connectors and cables increases the expense in fabrication in parts as well as labor. Similarily, by mounting the printed circuit board perpendicular to the front panel, the total unit housing doesn't make efficient use of the interior space. Similarily, by providing the power supply within the same housing as the printed circuit board or boards, the overall size of the housing is increased and the boards are subjected to increased temperatures which shortens the life of the components and affects their operating characteristics. Thus, there exists a need for a new design for an interface adaptor printed circuit board and housing.

SUMMARY OF THE INVENTION

An object of the present invention is to provide a non-dedicated communication interface adaptor mounted to a single printed circuit board.

Another object is to provide a housing for a communication interface adaptor which is a substantial reduction in size over the prior art housings.

A further object of the present invention is to reduce the temperature to which the communication adaptor is exposed to by the power supply.

Still another object of the present invention is to reduce the overall cost of manufacture and assembly of the communication interface adaptor by minimizing the interconnection of the printed circuit board to the other functional elements of the adaptor.

The objects of the present invention are achieved by providing the non-dedicated communication interface adaptor on a single printed circuit board. The printed circuit board also includes, mounted directly to the back plane, input/output connectors for the line and peripheral devices, and a connector for the power supply. Mounted directly to the front plane of the printed circuit board are the required switches and indicators. The printed circuit board is contained in a housing having the general configuration of the printed circuit board wherein the front and rear panels are parallel to the front panel of the printed circuit board. Apertures in the front panel are provided and aligned with the indicators and switches mounted to the front plane of the circuit board. The rear panel of the housing includes apertures for the input/output connectors and the power supply connectors. The printed circuit board is mounted correctly to the rear panel of the housing by fasteners received in internally threaded stand-offs which are mounted to and extend from the rear plane of the printed circuit board. The power supply is separate from the adapter's printed circuit board housing and is connected external of the adapter's housing through the power supply connector. The housing for the power supply is mounted to the rear panel of the adapter's printed circuit board housing. Flanges are provided on the sides of the printed circuit board housing so as to mount the housing and the printed circuit board vertically.

Other objects, advantages, and novel features of the present invention will become apparent from the following detailed description of the invention when considered in conjunction with the accompanying drawings.

BRIEF DESCRIPTION OF THE DRAWINGS

FIG. 4 is a front elevational view of the communication interface adaptor with front panel removed.

FIG. 5 is a front elevational view of the communication interface adaptor.

DESCRIPTION OF THE PREFERRED EMBODIMENTS

Figure 1:
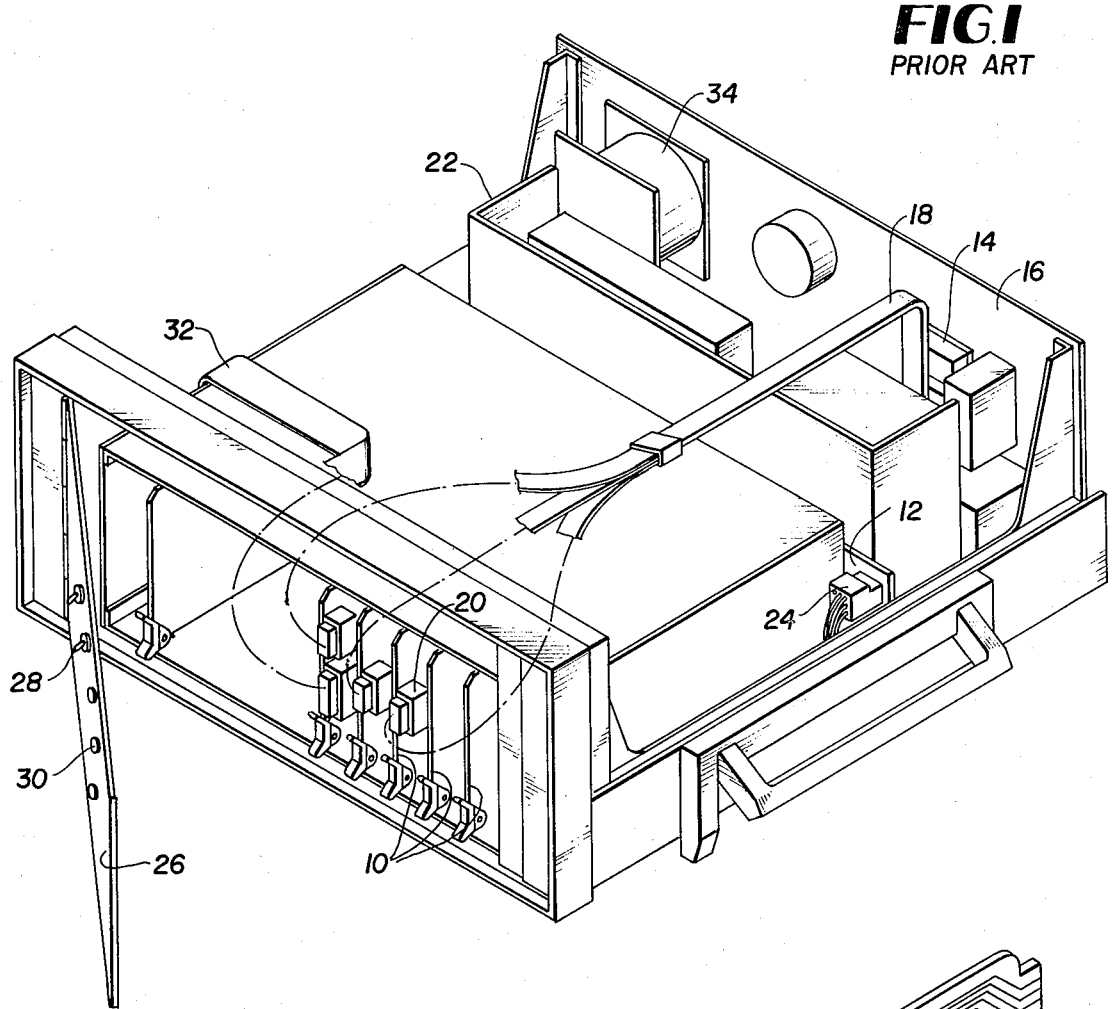
FIG. 1 is a perspective view of a communications interface adaptor of the prior art with the top cover removed.
Figure 2:
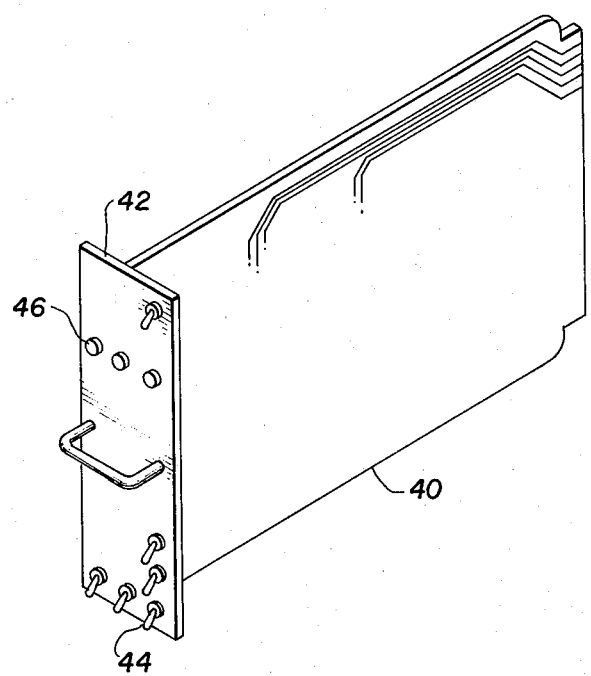
FIG. 2 is a perspective view of a single printed circuit board communications interface adaptor mounted to a face plate.
Figure 3:
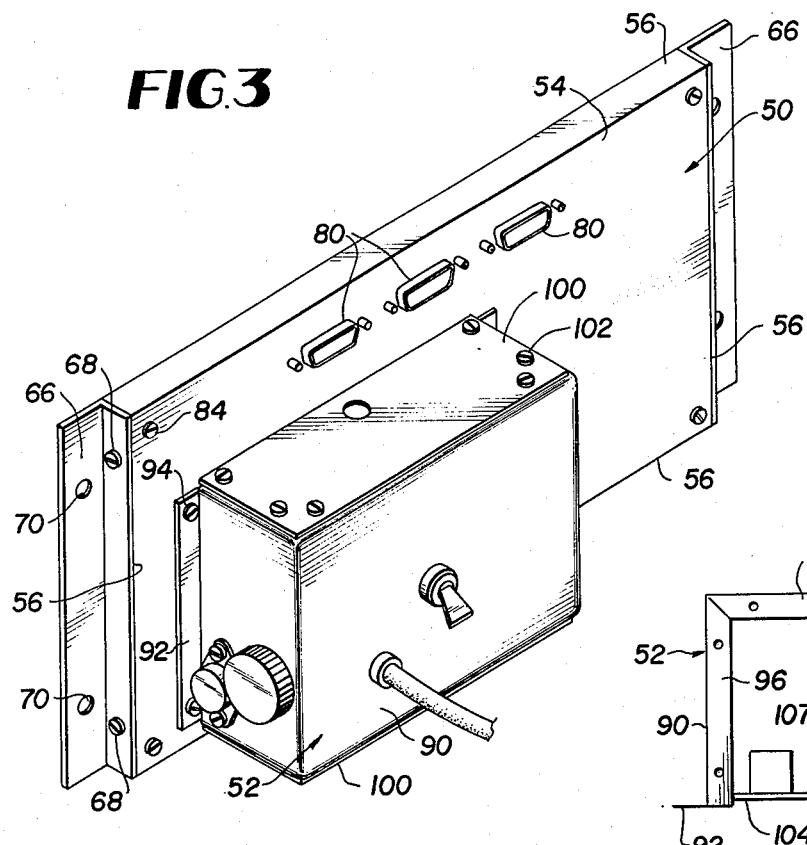
FIG. 3 is a rear perspective view of a communications interface adaptor and power supply according to the principles of the present invention.
Figure 8:
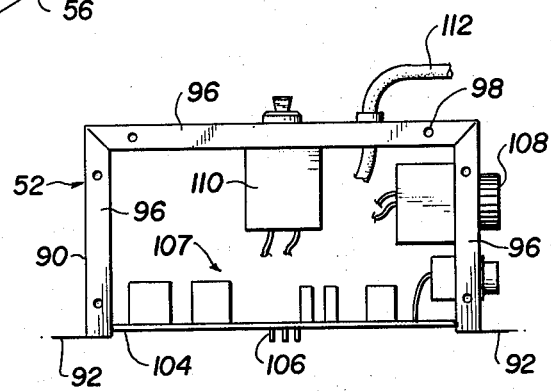
FIG. 8 is a side elevational view of the power supply with side panel removed.

A single printed circuit board communication interface adapter and housing as illustrated in FIGS. 3 through 8 includes a single printed circuit board communication interface adapter housing 50 and a power supply housing 52. The communication adapter housing 50 includes a rear panel 54 having four integral sides 56 extending therefrom. The longitudinal side panels 56 terminate in a front panel mounting flange 58 parallel to the rear panel 54. A pair of openings 60 are provided in each of the front panel mounting flanges 58. The front panel 62 is mounted to the front panel mounting frame 58 by four fasteners 64 which may be knurled captive thumb screws. Also mounted to the longitudinal side panels 56 are a pair of mounting brackets 66 secured thereto by fasteners 68 and each include a pair of openings 70. The brackets 66 permit the mounting of the housing with the face plate vertically.

The front panel 62 includes a plurality of apertures through which extends a plurality of switches 72 and indicators 74. Additionally as illustrated in FIG. 5, an opening is provided for a digital display 76 and a plurality of set switches 78, one for each of three digits of the digital display 76.

Figure 6:
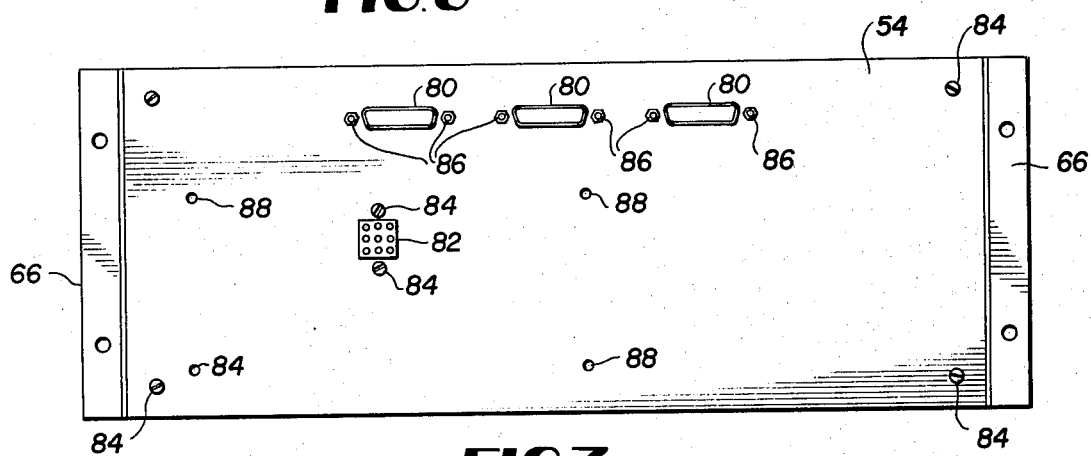
FIG. 6 is a rear elevational view of the communication interface adapter with the power supply removed.

As illustrated in FIG. 6, the rear panel 54 includes a plurality of openings for the input/output connectors 80 and a power supply connector 82. As will be explained more fully below, the printed circuit board in communication adapter interface housing 50 is secured directly to the rear panel by twelve connectors, four at the corners of the board, two adjacent each of the input/output connectors, and two adjacent the power supply connector. As illustrated in FIG. 6, fastener 84 is a pan head screw at the four corners and adjacent the power connector 82. Hex-locking assemblies 86 are shown adjacent the input/output connectors 80. Four apertures 88 are shown in the rear panel 54 having press-in nuts on the other side thereof to receive four fasteners which will secure the power circuit housing 52 to the printed circuit board communication interface adapter housing 50.

The power supply housing 52 includes a generally U-shaped housing 90 terminating in a pair of flanges 92. Four fasteners 94 secure the flanges 92 of the circuit breaker housing to the rear panel 54 of the printed circuit board housing 50 using the nuts in apertures 88 of the rear panel 54. The U-shaped housing portion 90 includes mounting flanges 96 along its generally U-shape with openings 98 therein. Side plates 100 are secured to the flanges 96 by fasteners 102 received in openings 98.

The power supply includes a printed circuit board 104 mounted to the U-shaped housing portion 90 having a nine pin printed circuit board mounting connector 106 which is to be received in the nine pin female connector 82 of the communication interface adapter printed circuit board. In addition to the filters, transformers, and other elements 107 of the power supply circuit, the power supply housing includes an audible alarm 108, a combination power switch/circuit breaker 110, and a power line cord 112. The power supply is mounted to the communication interface adapter by first removing side panel 100 from the U-shaped portion 90. The power supply is then positioned over the mounting area on the rear panel 54 of the communication interface adapter housing 50 and connector 106 is inserted into the mating connector 82 of the communication interface adapter. Once the connectors 106 and 82 are mated, fasteners 94 with locking washers mount the U-shaped housing 90 to the rear panel 54 of the communication adapter housing. Side panel 100 is then replaced or secured to the U-shaped housing 90 using fasteners 102.

By separately housing the power supply, it may be readily disconnected or detached from the communication interface adapter printed circuit board housing such that they can be separately shipped, stored, or repaired. Similarly, the external mounting of the power supply reduces the possible heating, and resulting increased aging, of the communication interface adapter electronics produced by the power supply elements. By using a separate external housing for the power supply, the overall configuration of the combined units is substantially less than the configuration having a single rectangular housing.

Figure 7:
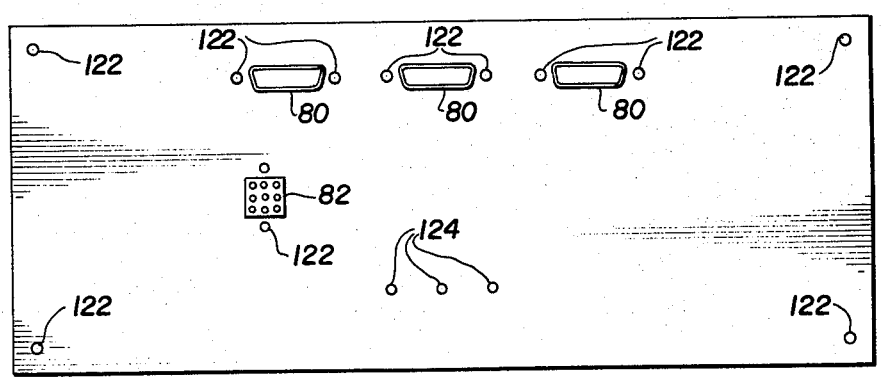
FIG. 7 is a rear elevational view of the printed circuit board of the communication interface adaptor.

The printed circuit board 120, the back plane of which is illustrated in FIG. 7, includes a plurality of internally threaded stand-offs swaged directly to the back plane thereof. The twelve stand-offs 122 are connected respectively at the four corners of the board and adjacent each of the connectors 80 and 82. Additional stand-offs 124 may be provided for additional support of the board as necessary. The specific stand-offs 124 illustrated are directly behind the location of ROMs which are removeable and provide additional support of the board during insertion of the prongs. Additional stand-offs may be provided if and where desired.

The front plane of the board, as illustrated in FIG. 4, includes the plurality of switches 72 and indicators 74 as well as the digital display 76 and set switches 78 mounted directly thereto. A plurality of additional switches 126 are provided on the circuit board 120 which are not exposed through openings in the face plate 62. These switches provide selection of terminal data rate, channel identification and other variables related to formating or protocol. The other main elements of the communication interface adapter includes a central processing unit 128, read only memories 130, random access memories (RAM) 132, and universal synchronous asynchronous receiver transmitters (USART) 134.

The printed circuit board 120 is assembled into the housing by maneuvering the circuit board first under one front panel mounting flange 58 and then the other. The connectors 80 and 82 are positioned through the respective apertures and the stand-offs 122 are aligned with the respective apertures in the rear panel 54 of the communication interface adapter printed circuit board housing 50. Fasteners 84 and 86 then secure the printed circuit board via the stand-offs to the rear panel 54. The front panel 62 is then positioned on the front panel mounting flange 58 and secured thereto by fasteners 64. The power supply and power supply housing are then mounted to the rear of the communication interface adapter.

As can be seen from the above description, by mounting all of the input-output connectors, power connectors, switches and indicators directly to the printed circuit board, no harnesses or external wiring is needed. This reduces the amount of space and labor involved in assemblying or wiring the present circuit. Similarly, by mounting the circuit parallel to the face of the package and mounting the power supply external to the housing, a unique flat-pack configuration results.

From the preceding description of the preferred embodiments it is evident that the objects of the invention are obtained in that a new and improved single printed circuit board communication interface adapter and housing is provided. Although the invention is described and illustrated in detail, it is to be clearly understood that the same is by way of illustration and example only, and is not to be taken by way of limitation. The number of input/output connectors as well as switches and indicators are merely to illustrate one specific communication interface adapter circuit. The spirit and scope of this invention are to be limited only by the terms of the appended.

What is claimed:

1. In a communications interface adapter having a controller means, memory means, a plurality of switch means for providing manual control of said adapter, a plurality of indicator means for indicating operation of said adapter, a first and second connector means for providing input/output terminals for lines to be interfaced, a power supply means and a housing, the improvement comprising:

a printed circuit board having a front plane and a back plane;

said controller means, memory means, plurality of switch means, and plurality of indicator means being mounted to said front plane of said printed circuit board, said first and second connector means being mounted to said back plane of said printed circuit board;

a third connector means being mounted to said back plane of said printed circuit board for providing terminals for said power supply means;

said housing including a first section for housing said printed circuit board and a second section for housing said power supply means;

said first housing section having a closed generally rectangular configuration with face aand rear portions parallel to said front and back planes of said printed circuit board, said face portion including a plurality of apertures each aligned with a respective switch means or indicator means, said rear portion including a plurality of openings each aligned with a respective connector means;

said printed circuit board being mounted in and enclosed by said first housing section;

said power supply means being removeably connected to said third connector means external to said first housing section; and said second housing section being removeably mounted to said rear portion of said first housing section and encompassing said power supply means.

2. The communications interface adapter according to claim 1 wherein said rear portion of said first housing section includes four side portions integral therewith and extending perpendicular therefrom encompassing the edges of said printed circuit board, and said face portion is removeably mounted to said side portions.

3. The communications interface adapter according to claim 2 wherein two opposed side portions include integral flanges extending parallel to said front plane of said circuit board and said face portion is removeably mounted to said flanges.

4. The communications interface adapter according to claim 1 including flange means mounted to said first housing section for vertically mounting said front plane of said printed circuit board to a support.

5. The communications interface adapter according to claim 1 wherein said printed circuit board is mounted directly to said rear portion.

6. The communications interface adapter according to claim 5 including a plurality of stand-offs mounted to said rear plane of said printed circuit board, each including a threaded bore, and fasteners mounting said printed circuit board to said rear portion via said stand-offs.

7. The communications interface adapter according to claim 1 wherein said second housing section includes a pair of flanges extending parallel to said rear portion of said first housing section and fasteners mounting said flanges to said rear portion.

8. The communications interface adapter according to claim 1 wherein said memory means includes read only memory modules, said modules are removeably mounted to said circuit board.

* * * * *